United States Patent
Yamamoto et al.

(10) Patent No.: US 7,416,985 B2
(45) Date of Patent: Aug. 26, 2008

(54) SEMICONDUCTOR DEVICE HAVING A MULTILAYER INTERCONNECTION STRUCTURE AND FABRICATION METHOD THEREOF

(75) Inventors: Tamotsu Yamamoto, Kawasaki (JP); Hirofumi Watani, Kawasaki (JP); Hideki Kitada, Kawasaki (JP); Hiroshi Horiuchi, Kawasaki (JP); Motoshu Miyajima, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 293 days.

(21) Appl. No.: 11/042,355

(22) Filed: Jan. 26, 2005

(65) Prior Publication Data

US 2005/0212137 A1    Sep. 29, 2005

Related U.S. Application Data

(63) Continuation of application No. PCT/JP02/13677, filed on Dec. 26, 2002.

(51) Int. Cl.
H01L 21/4763 (2006.01)
H01L 21/311 (2006.01)
H01L 21/461 (2006.01)

(52) U.S. Cl. .................. 438/692; 438/622; 438/624; 438/625; 438/626; 438/631; 438/645; 438/697; 438/760

(58) Field of Classification Search .............. None
See application file for complete search history.

(56) References Cited

U.S. PATENT DOCUMENTS

| | | | |
|---|---|---|---|
| 6,001,730 A * | 12/1999 | Farkas et al. | ................. 438/627 |
| 6,255,217 B1 | 7/2001 | Agnello et al. | |
| 6,297,154 B1 | 10/2001 | Gross et al. | |
| 6,440,844 B1 | 8/2002 | Takagi et al. | |
| 6,660,634 B1 * | 12/2003 | Ngo et al. | ................. 438/687 |
| 6,709,970 B1 * | 3/2004 | Park et al. | ................. 438/620 |

(Continued)

FOREIGN PATENT DOCUMENTS

EP    0 982 771 A1    3/2000

(Continued)

OTHER PUBLICATIONS

Masaaki Hatano et al., *EM lifetime improvement of Cu damascene interconnects by P-SiC cap layer*, IITC_09_18 (2002).

*Primary Examiner*—Carl Whitehead, Jr.
*Assistant Examiner*—James M Mitchell
(74) *Attorney, Agent, or Firm*—Westerman, Hattori, Daniels & Adrian, LLP.

(57) ABSTRACT

A multilayer interconnection structure includes a first interlayer insulation film, a second interlayer insulation film formed over the first interlayer insulation film, an interconnection trench formed in the first interlayer insulation film and having a sidewall surface and a bottom surface covered with a first barrier metal film, a via-hole formed in the second interlayer insulation film and having a sidewall surface and a bottom surface covered with a second barrier metal film, an interconnection pattern filling the interconnection trench, and a via-plug filling the via-hole, wherein the via-plug makes a contact with a surface of the interconnection pattern, the interconnection pattern has projections and depressions on the surface, the interconnection pattern containing therein oxygen atoms along a crystal grain boundary extending from the surface toward an interior of the interconnection pattern with a concentration higher than a concentration at the surface.

10 Claims, 10 Drawing Sheets

U.S. PATENT DOCUMENTS

| | | | |
|---|---|---|---|
| 6,723,631 B2 * | 4/2004 | Noguchi et al. | 438/618 |
| 6,927,160 B1 * | 8/2005 | Kitch | 438/631 |
| 2003/0008493 A1 * | 1/2003 | Lee | 438/626 |
| 2005/0112871 A1 * | 5/2005 | Ahn et al. | 438/649 |
| 2007/0020918 A1 * | 1/2007 | Hirokawa et al. | 438/626 |

FOREIGN PATENT DOCUMENTS

| | | |
|---|---|---|
| JP | 11-186261 | 7/1999 |
| JP | 2000-200832 | 7/2000 |
| JP | 2001-44200 | 2/2001 |
| JP | 2001-160558 | 6/2001 |
| JP | 2001-257209 | 9/2001 |
| JP | 2001-284355 | 10/2001 |
| JP | 2002-33385 | 1/2002 |

* cited by examiner

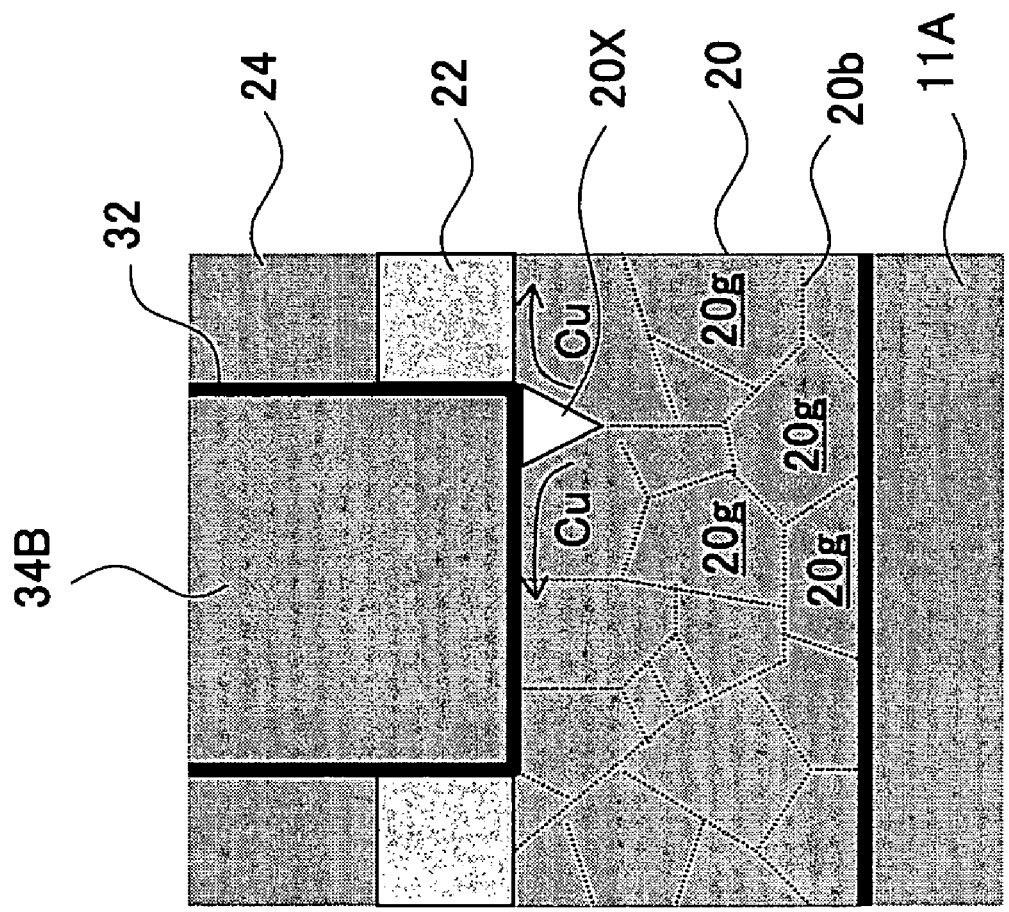

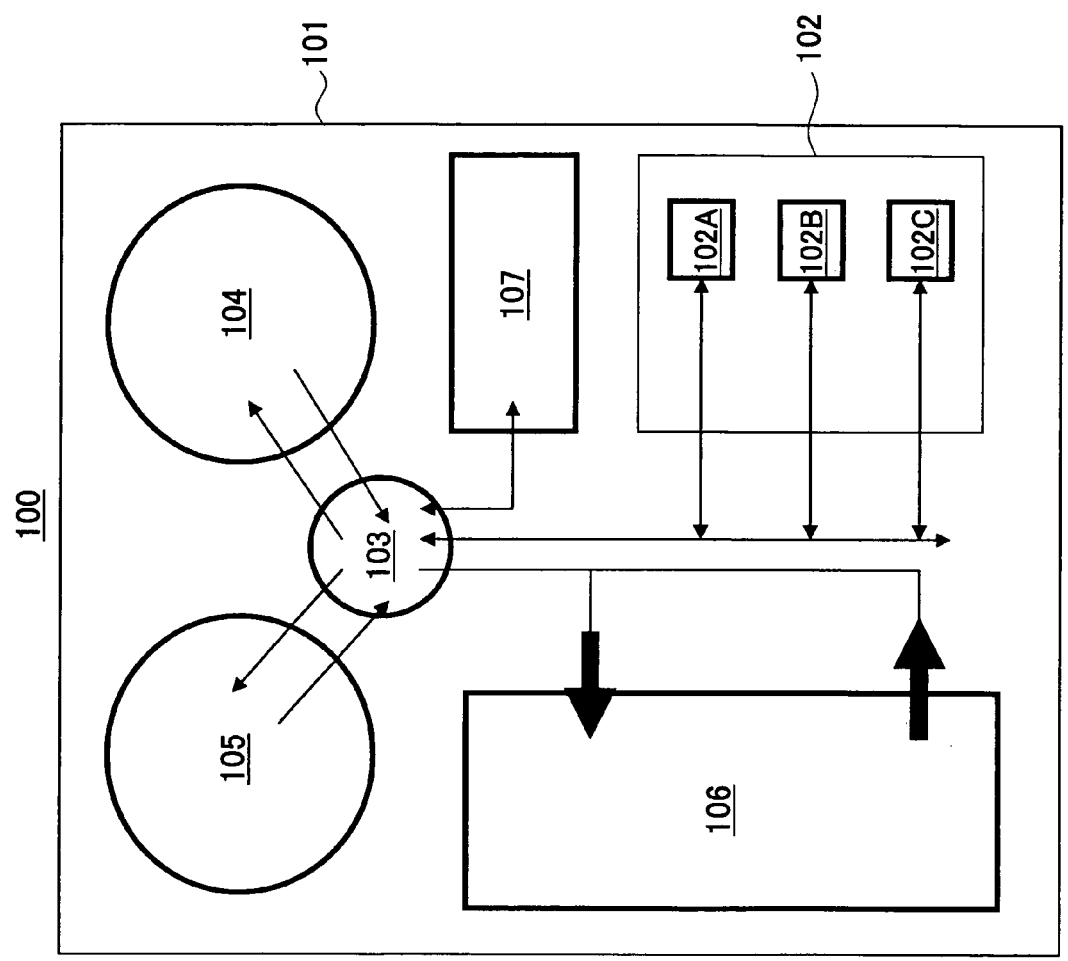

US 7,416,985 B2

SEMICONDUCTOR DEVICE HAVING A MULTILAYER INTERCONNECTION STRUCTURE AND FABRICATION METHOD THEREOF

CROSS-REFERENCE TO RELATED APPLICATIONS

The present invention is a continuation application filed under 35 U.S.C. 111(a) claiming benefit under 35 U.S.C. 120 and 365(c) of PCT application JP2002/13677 filed on Dec. 26, 2002, the entire contents of which are incorporated herein as reference.

BACKGROUND OF THE INVENTION

The present invention relates to semiconductor devices and fabrication method thereof and more particularly to a semiconductor device having a multilayer interconnection structure and fabrication method thereof.

With progress in the art of device miniaturization, integration density of semiconductor integrated circuits is increasing year by year. On the other hand, with such increase of integration density, there arises the problem of signal delay in such a semiconductor integrated circuit caused by wiring resistance and wiring capacitance. In view of this problem of signal delay, investigations are being made these days about the technology of using low-resistance Cu for the interconnection pattern and low-dielectric organic film for the interlayer insulation film.

Because there is no known dry etching method that is effectively used for patterning Cu, it has been practiced conventionally to use a dual damascene process in the case of using Cu for the interconnection pattern, in which interconnection trenches and contact holes are formed in an interlayer insulation film in advance and the same is filled with Cu. Thus, with the dual damascene process, the contact holes and the interconnection trenches are filled with an interconnection material such as Cu, and the interconnection material is polished out from the unnecessary part by a chemical mechanical polishing (CMP) process. Thereby a planarized interconnection pattern is obtained in the form that the interconnection pattern is embedded in the contact holes and the interconnection trench. According to such a dual damascene process, there is no need of forming interconnection pattern of narrow width and large aspect ratio by an etching process, and there is no need of filling the minute spaces between the interconnection patterns by the interlayer insulation film. Thereby, it becomes possible to form highly miniaturized interconnection patterns. The effect of forming a multilayer interconnection structure with such a dual damascene process increases with increasing aspect ratio of the interconnection pattern and increasing number of interconnection layers. Thus, formation of a multilayer interconnection structure with such a dual damascene process contributes to the significant reduction of production cost of ultra-fine semiconductor devices.

SUMMARY OF THE INVENTION

FIGS. 1A-1K show the process of forming a multilayer interconnection structure according to a typical conventional dual damascene process.

Referring to FIG. 1A, there is formed a lower level interconnection pattern 20 of polysilicon, W or Cu on a Si substrate 11, on which active devices such as a transistor not illustrated are formed, via an insulation film 11A, and a first etching stopper film 22 of SiN or SiC is formed on the lower level interconnection pattern 20 by a deposition process such as a plasma CVD process. Hereinafter, the explanation will be made for the case the lower level interconnection pattern 20 is formed of a Cu interconnection pattern.

On the etching stopper film 22, there is formed a first interlayer insulation film 24 of low dielectric inorganic insulation film or a low dielectric organic insulation film of organic hydrocarbon polymer or the like, and a second etching stopper film 26 of SiN or SiC is formed on the interlayer insulation film 24 by a plasma CVD process.

On the etching stopper film 26, there is formed a second interlayer insulation film 28 similarly, and a third etching stopper film 30 of SiN or SiC is formed on the interlayer insulation film 28 by a plasma CVD process, or the like.

In the step of FIG. 1A, there is formed a resist pattern R1 on the etching stopper film 30, wherein it should be noted that the resist pattern R1 is formed with a resist opening Ra in correspondence to a first layer interconnection trench to be formed in the multilayer interconnection structure.

Next, in the step of FIG. 1B, a dry etching process is applied to the SiN film 30 while using the resist pattern R1 as a mask, and there is formed an opening corresponding to the resist opening Ra in the etching stopper film 30. Further, after formation of the foregoing opening, the resist pattern R1 is removed by ashing, and the interlayer insulation film 28 is subjected to a dry etching process while using the SiN film 30 as a mask. With this, there is formed an interconnection trench 28A in the interlayer insulation film 28 in correspondence to the resist opening Ra.

Next, in the step of FIG. 1C, a resist film R2 is formed on the structure of FIG. 1B so as to cover the etching stopper film 30 and so as to fill the interconnection trench 28A, wherein the resist film R2 thus formed is patterned to form a resist opening Rb therein in correspondence to the via-hole to be formed in the interconnection groove in the interconnection trench 28A.

Further, in the step of FIG. 1D, the etching stopper film 26 is subjected to a dry etching process while using the resist pattern R2 as a mask, and there is formed an opening corresponding to the resist opening Rb in the etching stopper film 26.

In the step of FIG. 1D, the interlayer insulation film 24 is further subjected to the dry etching process while using the etching stopper films 26 and 30 as a mask, and there is formed a via-hole 24A in the interlayer insulation film 24 in correspondence to the resist opening Rb so as to expose the etching stopper film 22.

Further, in the step of FIG. 1E, the etching stopper film 22 exposed at the bottom of the via-hole 24A is removed by an etching process, and the Cu interconnection pattern 20 is exposed at the bottom of the via-hole 24A. Further, in the step of FIG. 1F, a barrier metal film 32 including therein a conductive nitride film such as a TaN film is deposited on the structure of FIG. 1E by a sputtering process, and the surface of the interconnection trench 28A and the surface of the via-hole 24A are covered with the barrier metal film 32 and a seed Cu film.

When forming the structure of FIG. 1E, it is also possible to use a process in which the via-hole 24A is formed at first and then the interconnection trench 28A is formed.

Next, in the step of FIG. 1G, a Cu layer 34 is formed by an electrolytic plating process so as to fill the interconnection trench 28A and the via hole 24A, followed by a thermal annealing process conducted in an inert ambient of nitrogen or Ar, such that there is caused a growth of crystal grains in the Cu layer 34. With this, there is obtained a stable microstructure.

Next, in the step of FIG. 1H, the Cu layer 34, the barrier metal film 32 and the etching stopper film 30 on the interlayer insulation film 28 is removed by a chemical mechanical polishing (CMP) process, and a planarized structure shown in FIG. 1H is obtained. In the structure of FIG. 1H, it should be noted that there is formed a Cu interconnection pattern 34A so as to fill the interconnection trench 28A, wherein there extends a Cu plug 34B filling the via hole 24A from the foregoing Cu interconnection pattern 34A. Thereby, the Cu interconnection pattern 34A and the Cu plug 34B form a first interconnection layer 31.

Next, the structure of FIG. 1H is processed by the plasma of $H_2$, $NH_3$, $N_2$ or a rare gas, and with this, contamination caused at the surface of the Cu interconnection pattern 34A at the time of the CMP process of FIG. 1H is removed.

After the step of FIG. 1I, the step of FIG. 1J is conducted, in which there is formed a cap film 35 of SiN or the like on the structure of FIG. 1I so as to cover the Cu interconnection pattern 34A, wherein the steps of FIGS. 1A-1H is repeated while using the cap film 35 as the etching stopper film 22. Thereby, a multilayer interconnection structure shown in FIG. 1K is obtained such that a second interconnection layer 41 is formed on the first interconnection layer 31.

By providing the cap layer 35, migration of the Cu atoms along the surface of the Cu interconnection pattern 34A is suppressed, and formation of defects formed in the lower interconnection layer with the process of forming the upper interconnection layer is suppressed together with formation of defects caused in the interconnection layers associated with the use of the multilayer interconnection structure under various conditions. Further, by conducting the surface processing step of FIG. 1I explained before, adherence between the interconnection pattern 34A and the cap layer 35 is improved. With regard to the improvement of adherence with the step of FIG. 1I, reference should be made to Japanese Laid-Open Patent Application 2000-200832.

Meanwhile, it is known that there occurs a phenomenon in which Cu atoms migrate on the interconnection layer surface and cause formation of defects such as voids in the case a semiconductor device having a Cu multilayer interconnection structure is applied with an electric conduction test under high temperature environment. For example, there can occur formation of a void or defect 20X in the Cu interconnection layer 20 as a result of such a test, which is usually conducted at the temperature of about 400° C. for accelerating the test.

Referring to FIG. 2, it can be seen that the Cu interconnection layer 20 is formed of a large number of Cu crystal grains 20g each defined by a grain boundary 20b. While illustration is omitted, similar microstructure is formed also in the Cu plug 34B.

It is believed that formation of such a void 20X has been caused as a result of the Cu atoms causing diffusion in the Cu interconnection layer 20 along the crystal grain boundary 20b as indicated by arrows in the drawing. Similar defects can be caused also in the interconnection pattern 34A or in the via-plug 34B. Formation of such a void can raise a serious problem in the reliability of multilayer interconnection structure, particularly in the case the void is formed in the part where the interconnection pattern 34B makes a contact with the Cu plug 34B.+

Further, it has been practiced conventionally, after the step of surface treatment processing of FIG. 1I by plasma, to heat the substrate to be processed to a temperature of about 400° C. in advance of the deposition of the cap layer 35 of FIG. 1J. As a result of such a process, there can be a case that projections 34X are formed on the surface of the cu interconnection pattern 34A as represented in FIGS. 3A and 3B. Here, it should be noted that FIGS. 3A and 3B represent respectively an enlarged cross-sectional view and enlarged plan view of the part circled in FIG. 1I.

Referring to FIGS. 3A and 3B, the Cu interconnection pattern 34A is formed of a large number of Cu crystal grains 34g each defined by a crystal grain boundary 34b and it can be seen that the foregoing projection 34X is formed in correspondence to a so-called triple point in which three crystal grain boundaries 34b merge with each other.

Thus, the projections 34X are formed in correspondence to the crystal grain boundaries 34b, and thus, it is believed that the projections 34X are formed as a result of migration of the Cu atoms taking place along the crystal grain boundary 34b. In the case of the projection 34X, it is believed that the migration of the Cu atoms along the crystal grain boundary is caused with relaxation of residual stress in the Cu interconnection pattern 34A. When such a projection 34X is formed, there is a possibility that the thin cap layer 35 no longer performs the function of barrier, and there arises a serious problem in the reliability of the multilayer interconnection structure.

In a first aspect, the present invention provides a multilayer interconnection structure, comprising:
a first interlayer insulation film;
a second interlayer insulation film formed over said first interlayer insulation film;
an interconnection trench formed in said first interlayer insulation film, said interconnection trench having sidewall surfaces and a bottom surface covered with a first barrier metal film;
a via-hole formed in said second interlayer insulation film, said via-hole having a sidewall surface and a bottom surface covered with a second barrier metal film;
an interconnection pattern filling said interconnection trench; and
a via-plug filling said via-hole;
said via-plug making a contact with a surface of said interconnection pattern,
said interconnection pattern having projections and depressions on said surface,
said interconnection pattern containing therein oxygen atoms along a crystal grain boundary extending from said surface toward an interior of said interconnection pattern with a concentration higher than a concentration at said surface.

In another aspect, the present invention provides a method of forming a multilayer interconnection structure, comprising the steps of:
forming an interconnection trench in said interlayer insulation film;
filling said interconnection trench with a metal layer; and
removing a part of said metal layer deposited on a surface of said interlayer insulation film with a chemical mechanical polishing process to form a metal interconnection pattern in said interconnection trench,
wherein there are further provided with the steps of:
forming, after said step of chemical mechanical polishing, an oxide film by oxidizing a surface of said metal interconnection pattern; and
removing said oxide film.

According to the present invention, diffusion of the metal element toward the surface of the metal interconnection pattern along such a crystal grain boundary is suppressed by introducing oxygen into the crystal grain boundaries in the metal interconnection pattern formed so as to fill the interconnection groove in the interlayer insulation film. Thereby, formation of defects such as void caused in the metal interconnection patterns constituting such a multilayer interconnection structure during the operation of the semiconductor device having such a multilayer interconnection structure such as conduction test, is suppressed. Further, according to the present invention, projections and depressions are formed on the surface of the metal interconnection pattern in correspondence to the morphology of the crystal grains in the metal interconnection pattern as a result of formation and removal of the oxide film, while formation of such projections and depressions increases the length of diffusion of the metal element along the surface of the metal interconnection pattern. Thereby, escaping of the metal atoms to the outside of the metal interconnection pattern by diffusion is suppressed.

In a further aspect of the present invention, there is provides a method of forming a multilayer interconnection structure, characterized by the steps of:

forming an interconnection trench in an interlayer insulation film;

filling said interconnection trench with a metal layer;

removing a part of said metal layer deposited on a surface of said interlayer insulation film by a chemical mechanical polishing process;

annealing said metal layer after said step of chemical mechanical polishing; and planarizing a surface of said metal interconnection layer after said annealing step.

According to the present invention, the stress remaining in the metal layer is relaxed effectively by annealing the metal layer in the state in which the chemical mechanical polishing process is conducted. While there can be a case in which projections explained with reference to FIGS. 3A and 3B are formed on the surface of the metal layer as a result of stress migration of the metal atoms with such stress relaxation, the present invention removes such projections by applying a planarization process to the surface of the metal layer after such a process. Thereby, a metal layer or metal interconnection pattern having a planarized surface and entirely free from stress is obtained. Particularly, in the case the thermal annealing process is conducted in the state in which the metal interconnection pattern is formed in the interconnection trench, the chemical mechanical polishing process is conducted already, and thus, only a slight polishing process of removing the barrier metal film from the surface of the interlayer insulation film is sufficient for the subsequent planarization process, and thus, introduction of residual stress again into the metal interconnection pattern as a result of the planarization process is effectively avoided. With regard to such a residual stress in the metal layer, it should be noted that the residual stress is relaxed for the Cu layer 34 as a whole in the example of the Cu layer 34 of FIG. 1G as a result of the thermal annealing process conducted for recrystallization and crystal grain growth, while there still exists a possibility that local residual stress still remains in the interior of the Cu layer 34 in such a case in which mere thermal annealing process is applied to the state in which such a thick Cu layer 34 is formed. Further, there still exists a possibility that a residual stress is introduced newly into the metal interconnection pattern at the time of the chemical mechanical polishing process of FIG. 1H. The present invention addresses such conventional problems.

Other features and advantages of the present invention will become apparent from the following detailed explanation of the present invention made with reference to the drawings.

BRIEF DESCRIPTION OF THE DRAWINGS

FIG. 2 is a diagram showing the mechanism of formation of defects in the conventional multilayer interconnection structure;

FIG. 8 is a diagram showing the construction of a CMP apparatus used with the second embodiment of the present invention.

DETAILED DESCRIPTION OF THE PREFERRED EMBODIMENTS

First Embodiment

Hereinafter, a first embodiment of the present invention will be explained.

Figure 1A:
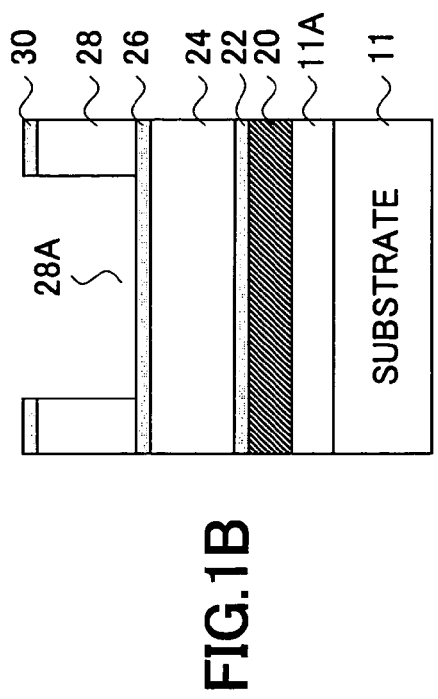
FIGS. 1A-1K are diagrams showing the formation process of conventional multilayer interconnection structure that uses a dual damascene process.
Figure 1B:
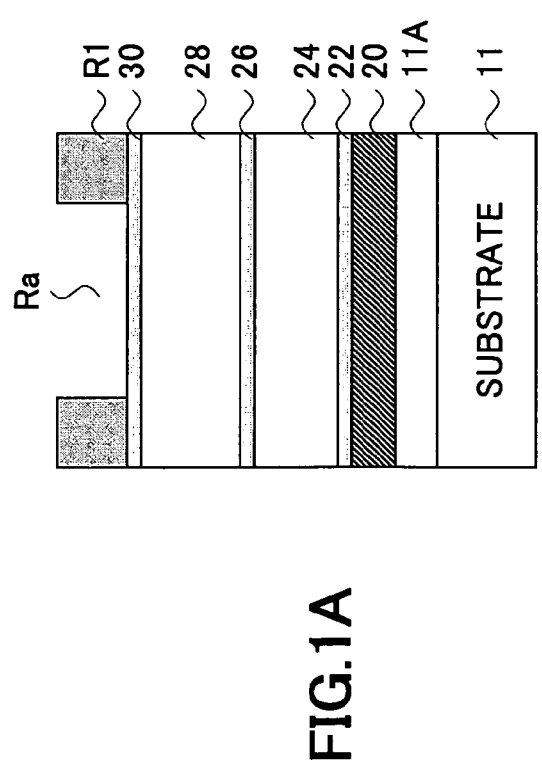
Figure 1C:
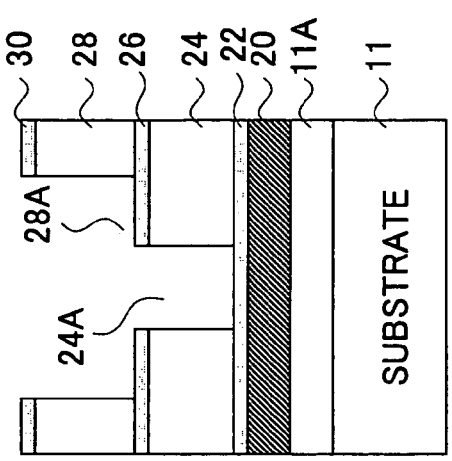
Figure 1D:
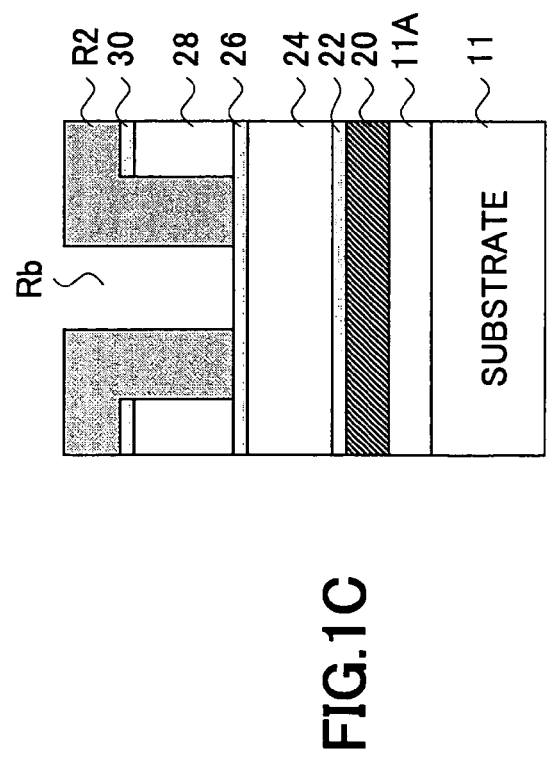
Figure 1E:
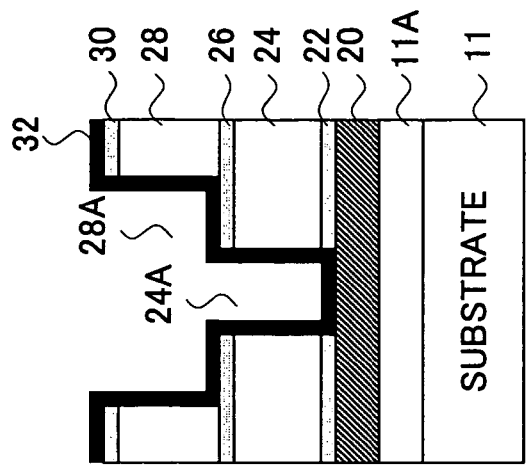
Figure 1F:
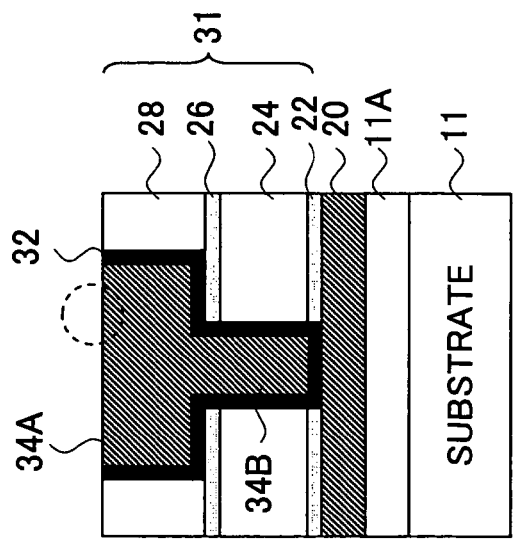
Figure 1G:
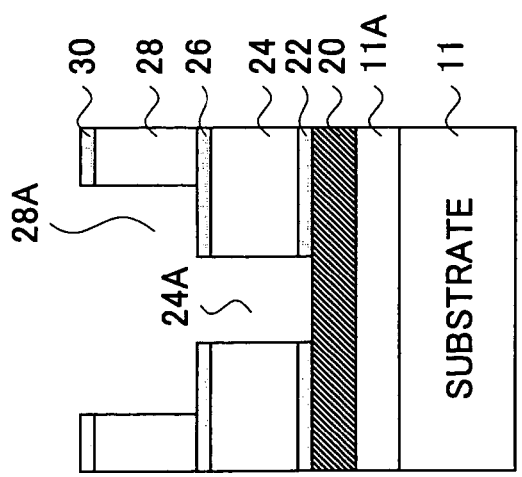
Figure 1H:
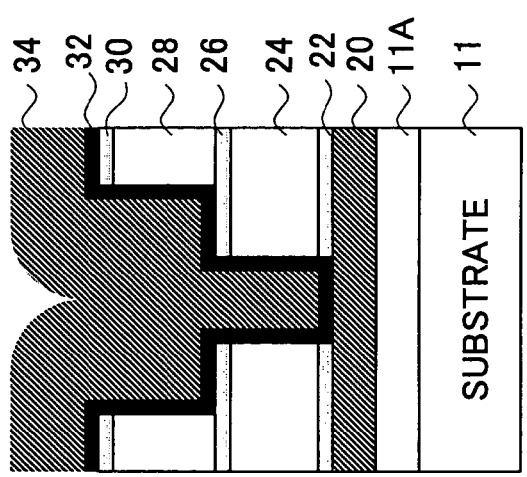

In the present embodiment, the process steps of FIGS. 1A-1H explained previously are conducted, and there is obtained a structure shown in FIG. 1H in which the Cu pattern 34A is formed in the interlayer insulation film 28 via the barrier metal film 32 and the Cu plug 34B is formed in the interlayer insulation film 24 via the barrier film 32.

Here, it should be noted that the present invention uses a low-K dielectric aromatic hydrocarbon polymer marketed from Dow Chemical Inc. with the trademark SiLK for the interlayer insulation films 24 and 28 and an SiC film formed by a plasma CVD. process for the etching stopper film 22. Thereby, it is preferable to carry out the plasma CVD process for forming the SiC film at the substrate temperature of about 400° C. by using trimethyl silane for the source material while supplying a high frequency power of 50-700 W. For the barrier metal film 32, it is possible to use an ordinary barrier metal film in which a TaN film and a Ta film having a thickness of about 10-20 nm are laminated. Such a barrier metal film can be formed by a sputtering process or reactive sputtering process.

Of course, it is possible to use films other than the organic hydrocarbon polymer film for the interlayer insulation film 28. Such films include an organic SOG film, an inorganic siloxane film such as HSQ (hydrogen silsesquioxane), an organic siloxane film such as MSQ (methyl silsesquioxane), a low-K dielectric porous film, or even a conventional $SiO_2$ film. Further, it is also possible to use a Ti film or TiN film for the barrier metal film 32.

Figure 4A:
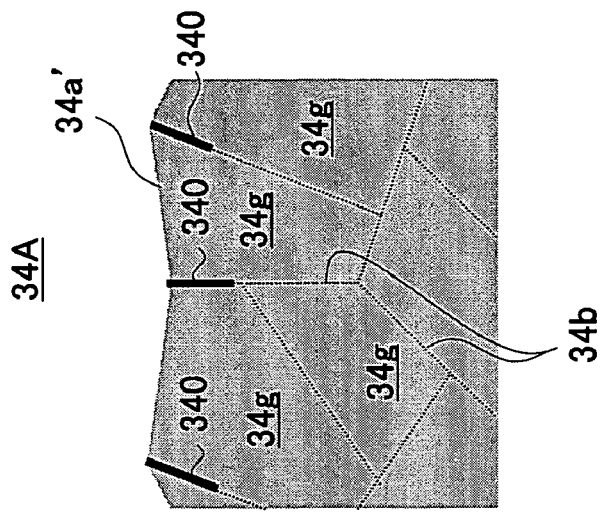
FIGS. 4A-4C are diagrams showing the method of forming a multilayer interconnection structure according to a first embodiment of the present invention.

FIG. 4A shows the surface part of the Cu interconnection pattern 34A circled by a broken line in the state of FIG. 1H with an increased magnification.

Referring to FIG. 4A, the Cu interconnection pattern 34A is formed of a large number of Cu crystal grains 34g defined by a grain boundary 34b as explained previously with reference to FIGS. 3A and 3B, wherein the interconnection pattern 34A has a principal surface 34a planarized by a CMP process.

Figure 1I:
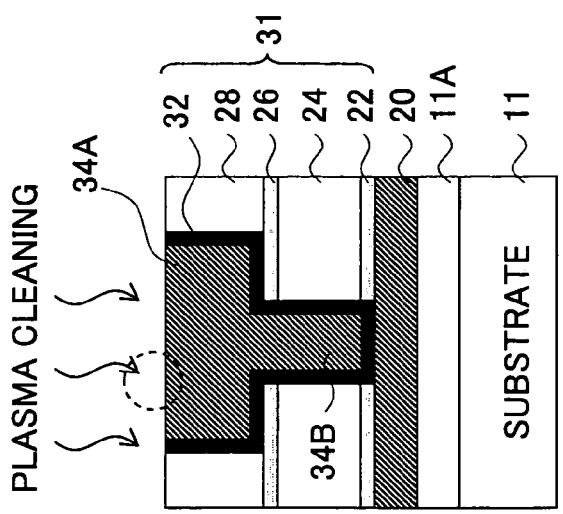
Figure 4B:
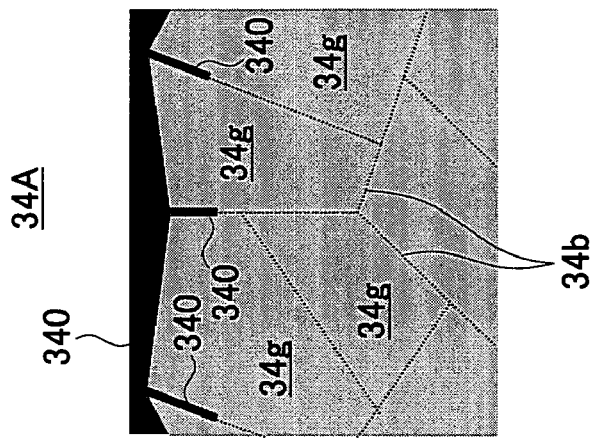

In the present embodiment, an oxygen plasma processing is conducted after the step of FIG. 1H but before the step of FIG. 1I and there is formed an oxide film 34O at the surface of the Cu interconnection pattern 34A as represented in FIG. 4B.

In the present embodiment, the foregoing oxidizing processing is conducted by holding the substrate to be processed in a processing vessel at a room temperature and supplying high-frequency plasma of 50-100 W under the pressure of 13.3 Pa (0.1 Torr). Thereby, the oxide film 34O of Cu is formed on the surface 34a of the Cu interconnection pattern 34A by supplying an oxygen gas into the processing vessel with the flow rate of about 100 SCCM. By conducting the foregoing plasma oxidation processing for 5 minutes, the oxide film 34O is formed with an average thickness of 25.4 nm. Further, in the case the plasma oxidation processing is conducted for two minutes, the oxide film 34O can be formed to have an average film thickness of 11 nm.

It should be noted that the oxide film 34O thus formed is formed of CuO or $Cu_2O$, or a mixture of CuO and $Cu_2O$ and has a feature that the film thickness changes in correspondence to the crystal grain boundary 34b. Further, with formation of such an oxide film 34O, the oxygen atoms penetrate into the interior of the Cu interconnection pattern 34A from the surface 34a along the crystal grain boundary, and as a result, there is formed a region 34o enriched with oxygen in the crystal grain boundary 34b that extends continuously from the foregoing surface 34a toward the interior of the Cu interconnection pattern 34A. In such a region 34o enriched with oxygen, too, oxygen forms a bond with the Cu atom constituting the Cu crystal 34g, and it is believed that there is formed an oxide film of CuO or $Cu_2O$ with the thickness of several atomic layers.

Figure 4C:
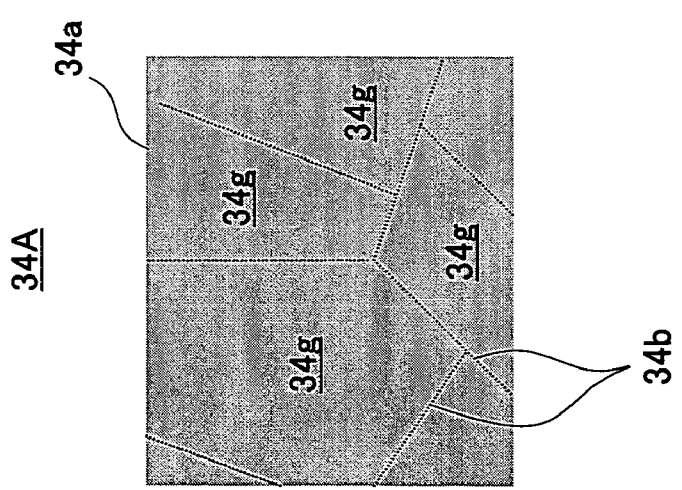

In the present embodiment, the process of FIG. 4C is conducted in place of the step of FIG. 1I after the step of FIG. 4B, wherein the oxide film 34O is removed by using $NH_3$ plasma or hydrogen plasma.

For example, such a process of removal of the oxide film is conducted by holding the substrate to be processed in a processing vessel at the temperature of 400° C. under the pressure of 240 Pa (1.8 Torr) while supplying the high frequency plasma of 200 W. Thereby, the oxide film 34O is removed as a result of reaction with plasma-excited hydrogen radicals by supplying the $NH_3$ gas to the processing vessel with the flow rate of 400 SCCM, and there are formed projections and depressions 34a' on the surface of the Cu interconnection pattern 34A in correspondence to the crystal grains 34g as shown in FIG. 4C. As shown in FIG. 4C, there still remains the oxide film 34o formed at the crystal grain boundary even after the oxide film 34O is removed. Here, it should be noted that the oxide film removal step of FIG. 4C can be conduced also by supplying a hydrogen gas in place of the $NH_3$ gas.

It should be noted that the step of FIG. 1I explained previously with reference to the conventional art is provided for eliminating contamination and improving the adherence between the inorganic barrier layer and the Cu interconnection layer, by exposing the surface of the Cu interconnection layer to a non-oxidizing plasma ambient of $H_2$, $N_2$, $NH_3$ or a rare gas at the time of forming the inorganic barrier film of SiN or SiC on the Cu interconnection layer as set forth in Japanese Laid-Open Patent Application 2000-200832, or the like. Contrary to this, it should be noted that the step of FIG. 4C is provided for removal of the oxide film 34O formed in the step of FIG. 4B, and thus, the meaning of the process is entirely different, although the process of FIG. 4C uses similar $NH_3$ plasma or hydrogen plasma.

As a result of the step of FIG. 4C, there exists no oxygen atoms on the surface of the Cu interconnection pattern 34A except for the foregoing crystal grain boundary part reaching the surface. On the other hand, it should be noted that the structure of FIG. 4C does not only represent the case in which there exists no oxygen on the surface of the Cu interconnection pattern 34A but also the state in which the oxygen concentration at the surface is lower than the oxygen concentration at the foregoing grain boundary part.

Figure 1J:
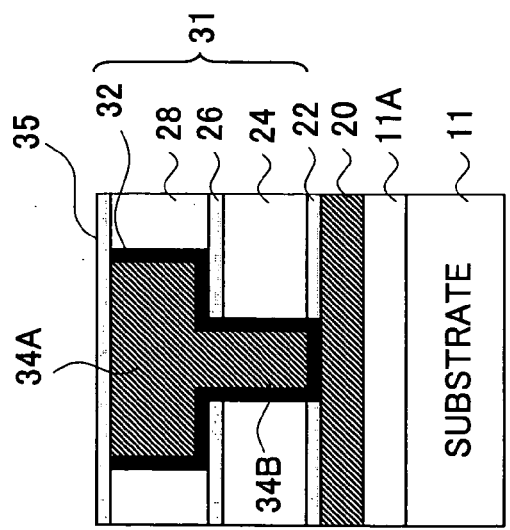
Figure 5:
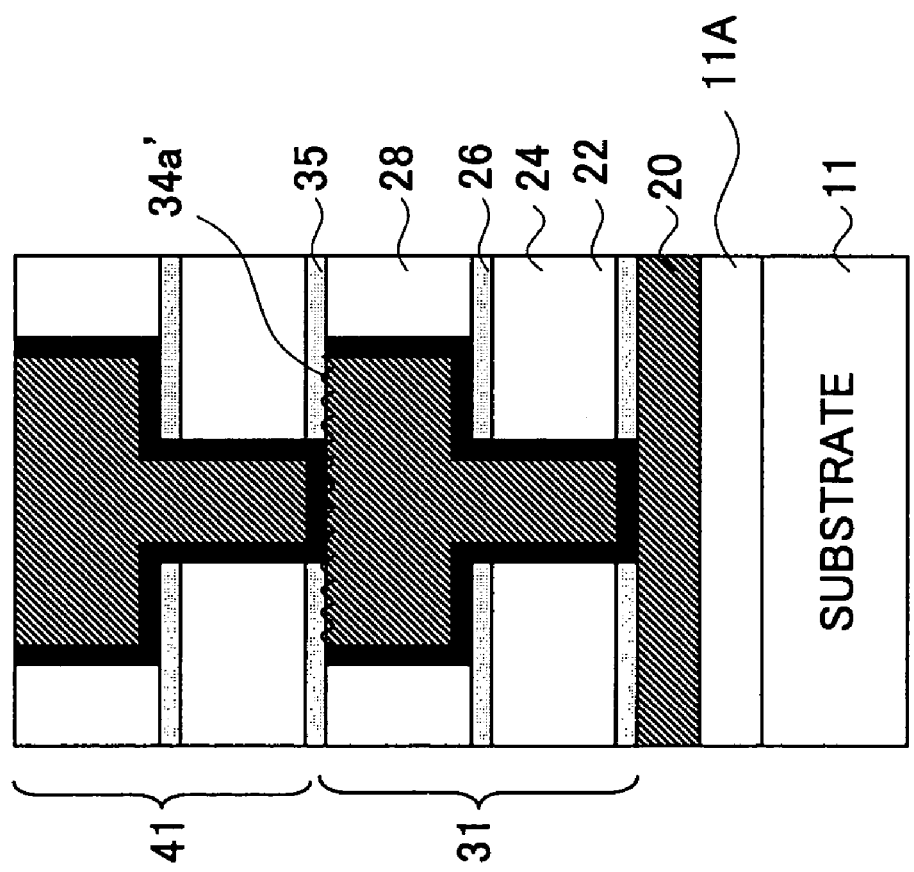
FIG. 5 is a diagram showing the construction of a semiconductor device having the multilayer interconnection of the first embodiment of the present invention.
Figure 6:
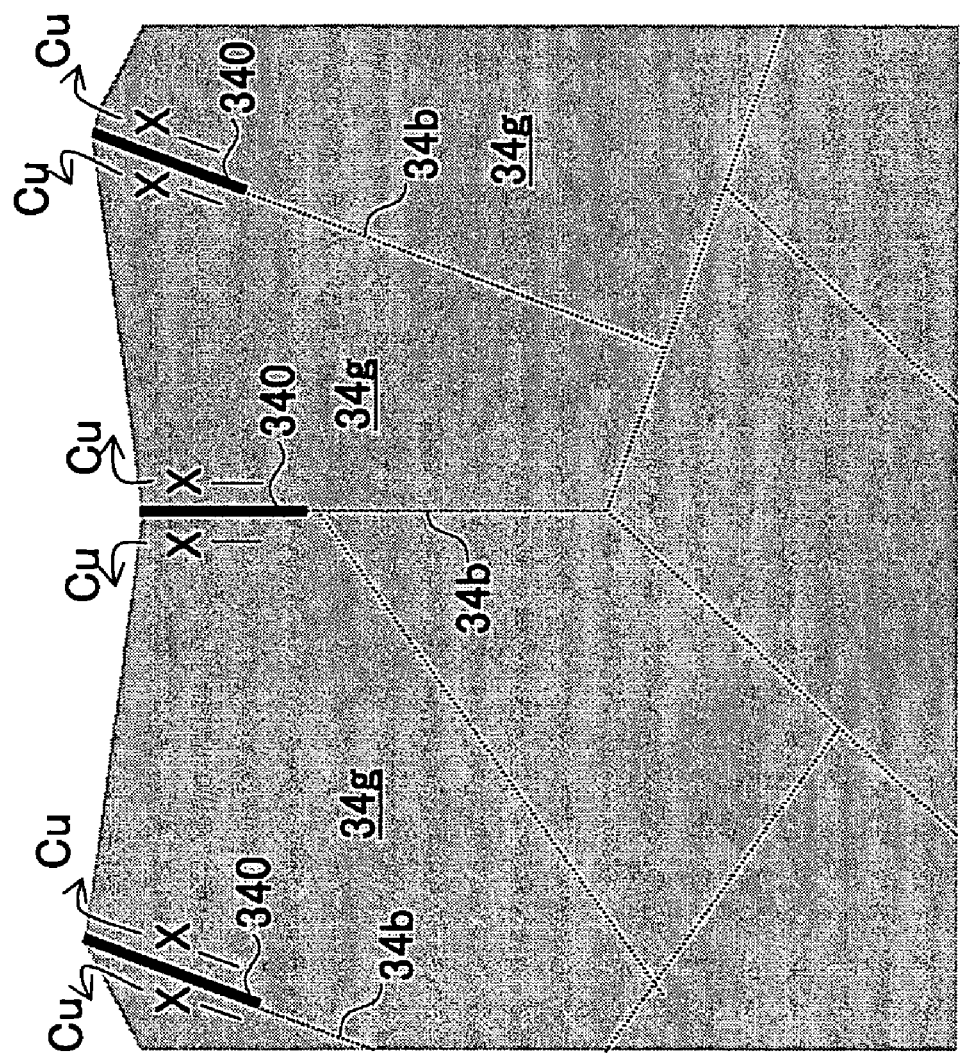
FIG. 6 is a diagram showing the suppressing of diffusion of the Cu atoms achieved with the multilayer interconnection structure of the first embodiment of the present invention.

After the step of FIG. 4C, the step of FIG. 1J and the steps thereafter are conducted, and a multilayer interconnection structure shown in FIG. 5 is obtained. In the present embodiment, it should be noted that the surface of the interconnection pattern 34A is formed with projections and depressions 34a', and the oxide film 34o of increased oxygen atomic concentration is formed in the part of the crystal grain boundary 34b that extends from the surface 34a' toward the interior of the interconnection pattern 34A.

In the present embodiment, in which the projections and depressions 34a' are formed at the surface of the interconnection pattern 34A, there occurs an increase in the diffusion distance for the Cu atoms migrating along the surface of the interconnection pattern 34A, and as a result, migration of the Cu atoms along the surface of the interconnection pattern 34A is suppressed.

Further, because oxide film or high oxygen concentration region 34o is formed at the crystal grain boundary in the vicinity of the surface of the interconnection pattern 34A in the present embodiment, there is caused pinning of Cu atoms in such a region by the oxygen atoms, and the diffusion of the Cu atoms to the surface is effectively suppressed. As a result, the problem of void formation explained previously with reference to FIG. 2 and occurred in the case the semiconductor device having the multilayer interconnection structure is operated or subjected to an electric conduction test, is successfully eliminated.

While the foregoing oxidation processing has been conducted by the plasma oxidation processing in the present embodiment, it is also possible to carry out the oxidation processing by a rapid thermal annealing process conducted in an oxygen ambient. Thereby, it is preferable that the formation of the oxide film 34O is conducted such that the thickness thereof does not exceed 30 nm, such as 25.4 nm or less as explained previously, in view of the expected increase of electrical resistance of the interconnection pattern 34A in the case the penetration of oxygen has occurred deeply into the interior of the interconnection pattern 34A along the crystal grain boundary 34o.

Examination of the surface state of the interconnection pattern 34A thus processed with a scanning electron microscope (SEM) reveals the fact that the proportion of the void 20X explained with reference to FIG. 2 has decreased by 60% in terms of the area ratio as compared with the comparative examples in which no such a processing has been conducted.

Second Embodiment

Next, the process of forming a multilayer interconnection structure according to a second embodiment of the present invention will be explained.

In the present embodiment, the process steps of FIGS. 1A-1G explained previously are conducted at first, and thus, the Cu layer 34 is formed on the barrier metal film 32 by an electrolytic plating process as shown in FIG. 1G, such that the Cu layer 34 fills the interconnection trench 28A and the via-hole 24A.

As explained previously, the low-K dielectric aromatic hydrocarbon polymer such as the one marketed from the Dow Chemical Inc. under the trademark SiLK is used for the low dielectric insulation films 24 and 28, while an SiC film formed by a plasma CVD process is used for the etching stopper film 22. Further, an ordinary barrier metal film in which a TaN film and a Ta film are laminated is formed for the barrier metal film 32.

In the present embodiment, too, it is possible to use films other than the organic hydrocarbon polymer film such as organic SOG film, an inorganic siloxane film such as HSQ (hydrogen silsesquioxane), an organic siloxane film such as MSQ (methyl silsesquioxane), a low-K dielectric porous film, or even a conventional $SiO_2$ film, for the interlayer insulation film 28. Further, it is also possible to use a Ti film or TiN film for the barrier metal film 32.

Figure 7A:
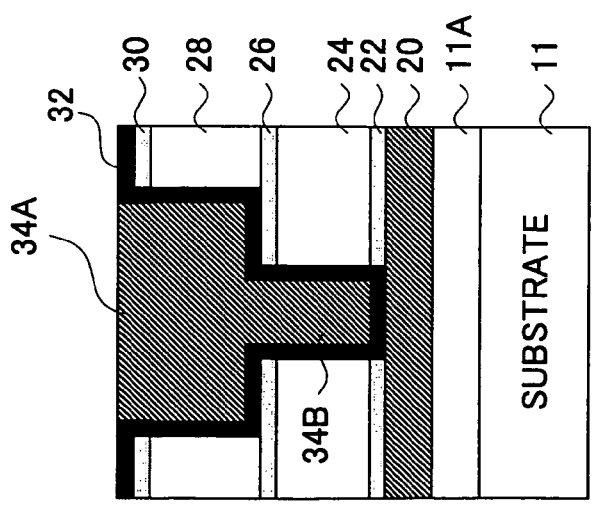
FIGS. 7A-7C are diagrams showing the method of forming a multilayer interconnection structure according to the second embodiment of the present invention.

In the preset embodiment, the step of FIG. 7A is conducted after the step of FIG. 1G, and the Cu layer 34 deposited on the barrier metal film 32 is removed by a CMP process while using the barrier metal film 32 as a stopper.

As explained previously, there is a possibility that there remains local residual stress inside the Cu layer 34 even when there is applied a thermal annealing process causing recrystallization of the Cu layer 34 in the step of FIG. 1G. Further, there is a possibility that the Cu layer 34 accumulates a stress newly in the CMP process of FIG. 1H. Thus, there is a possibility that substantial residual stress remains in the Cu interconnection pattern 34A in the state of FIG. 7A, while it is believed that it is such a residual stress that causes the formation of the defect 34X by interface diffusion of the Cu atoms as explained previously with reference to FIGS. 3A and 3B.

Figure 3B:
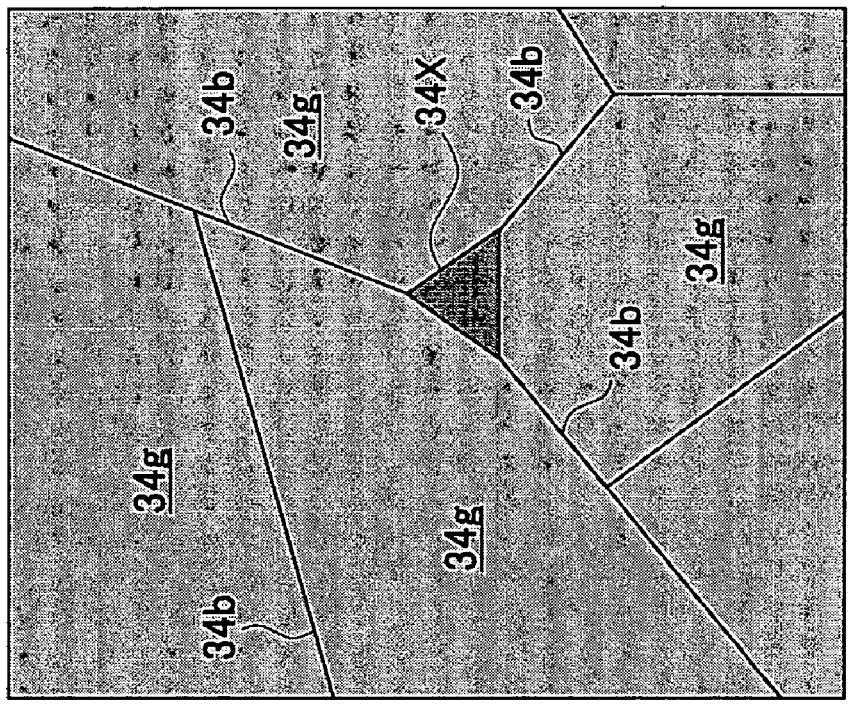
FIGS. 3A and 3B are further diagrams showing the mechanism of formation of defects in the conventional multilayer interconnection structure.
Figure 3A:
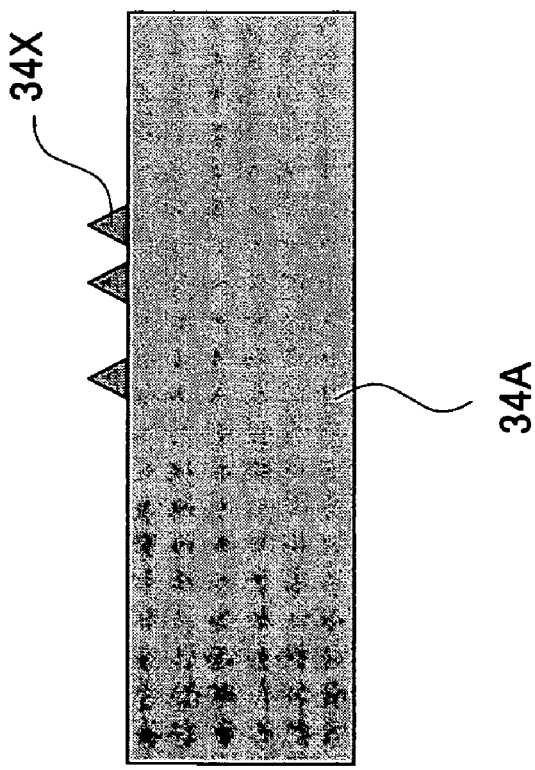
Figure 7B:
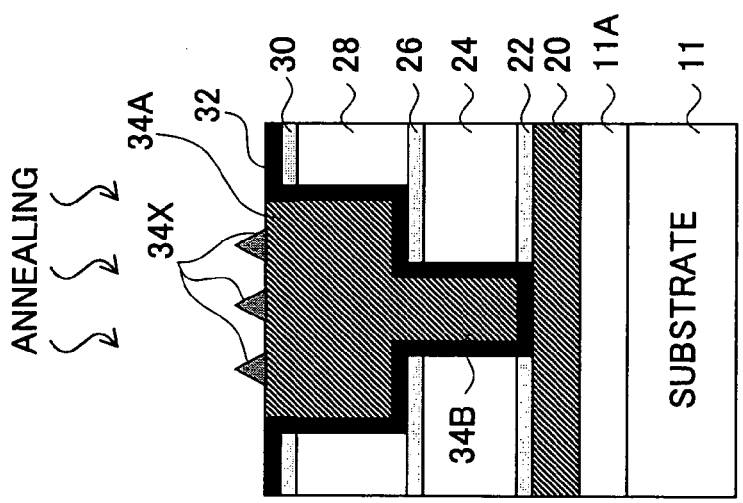

Thus, with the present embodiment, the step of FIG. 7B is conducted after the step of FIG. 7A, in which the structure of FIG. 7A is annealed in an inert ambient at the temperature of 250° C. or more but not exceeding 400° C. By conducting such a thermal annealing process in the nitrogen ambient of the atmospheric pressure, there is caused a stress relaxation in the Cu interconnection pattern 34A, and with this, projections 34X similar to the one explained with reference to FIGS. 3A and 3B are formed on the interconnection pattern 34A as a result of the diffusion of the Cu atoms caused in correspondence thereto, as shown in FIG. 7B. It should be noted that such projections 34X generally have the height of 1 μm or less.

Next, in the step of FIG. 7B, a CMP process is conducted while using the SiC film 30 as a stopper, and with this, the barrier metal film 32 on the SiC film 30 and also the SiC film 30 itself are removed. Wit this process, the surface of the Cu interconnection pattern 34A is planarized as a result of the polishing, and the projections 34X are removed as represented in FIG. 7C.

Figure 1K:
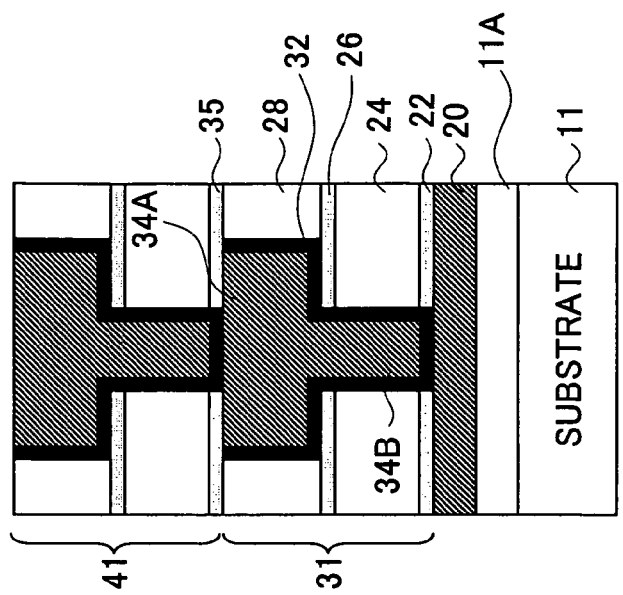
Figure 7C:
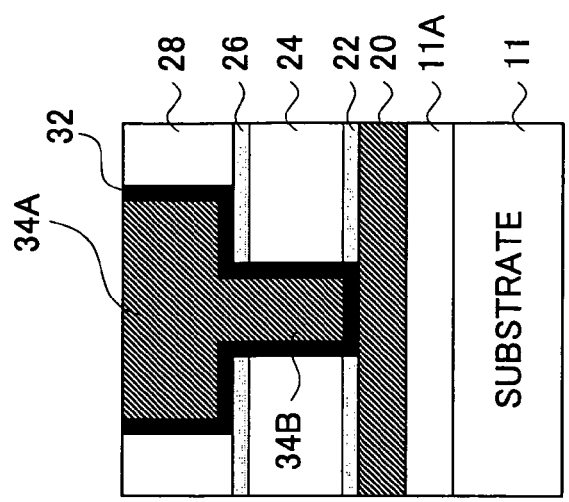

After the step of FIG. 7C, the impurity element at the surface of the Cu interconnection pattern 34A is removed in the cleaning step of FIG. 1I, and by conducting the process step of FIG. 1J and the process steps thereafter, the semiconductor device having the multilayer interconnection structure shown in FIG. 1K is obtained.

In the CMP process of FIG. 7C, there is a possibility that the Cu interconnection pattern 34A accumulates stress at the time of the polishing process, while because the total thickness of the barrier metal film 32 and the SiC film 30 is only less than 100 nm, such a polishing process does not cause any substantial accumulation of stress that would cause formation of the projections 34X upon thermal annealing process, in the Cu interconnection pattern 34A.

Thus, with the present embodiment, it is possible to form an interconnection structure free from residual stress in the interconnection pattern 34A and also in the via plugs 34B by a damascene process or dual damascene process. Because the expansion of the present embodiment to the case of single damascene process is obvious, further explanation will be omitted.

FIG. 8 shows the construction of a CMP apparatus 100 used with the present embodiment. It should be noted that the illustrated CMP apparatus 100 is not an essential element of the present embodiment, and it is also possible that the present embodiment can be implemented by using other apparatuses.

Referring to FIG. 8, the CMP apparatus 100 includes, on a base 101, a wafer cassette holder 102 holding wafer cassettes 102A-102C and a wafer transportation unit 103 transporting a wafer in the wafer cassette holder 102, wherein the CMP apparatus 100 further includes polishing platen units 104 and 105 to which the wafer is transported from the wafer transportation unit 103 and the wafer is returned back to the wafer transportation unit 103. Here, the polishing platen unit 104 is used for the CMP process of the Cu layer, while the polishing platen unit 105 is used for the CMP process of the barrier metal layer.

Further, there is provided, on the base 101, a cleaning unit 106 for cleaning the wafer polished by the polishing platens 104 and 105 and a furnace 107 for conducting the thermal annealing process of FIG. 7B., Thus, when a substrate processed to the state of FIG. 1G is held in any of the wafer cassettes 102A-102C in the wafer cassette holder 102 for further processing, the wafer transportation unit 103 transfers the same to the polishing platen unit 104, and polishing of the Cu layer 34 is conducted. As a result of the CMP process in the polishing platen unit 104, a specimen having the structure of FIG. 7A is obtained, wherein the specimen thus obtained is forwarded the furnace 107 after the cleaning process in the cleaning unit 106.

In the furnace 107, a thermal annealing process explained with reference to FIG. 7B is conducted, and the obtained specimen is forwarded to the polishing platen 105 via the wafer transportation unit 103.

In the polishing platen 105, the CMP process of FIG. 7C is conducted, and the specimen thus processed is returned to the wafer cassette holder 102 after cleaning in the cleaning unit 106. It should be noted that the wafer transportation unit 103 includes a wet wafer unit that transports the wafer that has been processed by the polishing platens 104 and 105 and wet with purified water, and a dry unit that transports a dry wafer transported from the wafer cassettes 102A-102C, the cleaning unit 106 and the furnace 107.

By using the CMP apparatus 100 of FIG. 8, it becomes possible to carry out the process of FIGS. 7A-7C efficiently together with other cooperating processes.

In the CMP apparatus 100 of FIG. 8, it is also possible to carry out, in the case the base is not provided with the furnace 107, the desired processing by transporting the specimen of the state of FIG. 7A as a result of the processing in the polishing platen 104, to an external furnace.

In the present embodiment, explanation has been made for the case of conducting the thermal annealing process of FIG. 7B in the nitrogen ambient of the atmospheric pressure, while it is also possible to add a non-oxidizing gas such as a hydrogen gas to the nitrogen ambient. Further, it is possible to carry out the thermal annealing process in the vacuum environment of $133 \times 10^{-5}$ Pa ($10^{-5}$ Torr).

In the case the temperature of the thermal annealing process is lower than 250° C., no satisfactory stress relaxation is achieved in the step of FIG. 7B, and there remains a stress in the Cu interconnection pattern 34A. In the case the temperature of the thermal annealing process exceeds 500° C., on the other hand, the interlayer insulation film cannot withstand the thermal annealing process, particularly in the case a low-K dielectric organic insulation film is used for the interlayer insulation film. From this, the thermal annealing process of the step of FIG. 7B is preferably conducted in the temperature range of 250-400° C.

Further, it is also possible to conduct the oxidation processing and oxide film removal processing of the previous embodiment to the structure of FIG. 7C, in the case the Cu interconnection pattern 34A is formed.

Further, in each of the embodiments above, the Cu interconnection pattern 34A may be formed of a copper alloy.

Further, the present invention is not limited to the embodiments described heretofore, but various variations and modifications may be made without departing from the scope of the present invention.

According to the present invention, diffusion of the metal element toward the surface of the metal interconnection pattern along such a crystal grain boundary is suppressed by introducing oxygen into the crystal grain boundaries in the metal interconnection pattern formed so as to fill the interconnection groove in the interlayer insulation film. Thereby, formation of defects such as void caused in the metal interconnection patterns constituting such a multilayer interconnection structure during the operation of the semiconductor device having such a multilayer interconnection structure such as conduction test, is suppressed. Further, according to the present invention, projections and depressions are formed on the surface of the metal interconnection pattern in correspondence to the morphology of the crystal grains in the metal interconnection pattern as a result of formation and removal of the oxide film, while formation of such projections and depressions increases the length of diffusion of the metal element along the surface of the metal interconnection pattern. Thereby, escaping of the metal atoms to the outside of the metal interconnection pattern by diffusion is suppressed.

Further, according to the present invention, the stress remaining in the metal layer is relaxed effectively by annealing the metal layer in the state in which the chemical mechanical polishing process is conducted. While there can be a case in which projections explained with reference to FIGS. 3A and 3B are formed on the surface of the metal layer as a result of stress migration of the metal atoms with such stress relaxation, the present invention removes such projections by applying a planarization process to the surface of the metal layer after such a process. Thereby, a metal layer or metal interconnection pattern having a planarized surface and entirely free from stress is obtained. Particularly, in the case the thermal annealing process is conducted in the state in which the metal interconnection pattern is formed in the interconnection trench, the chemical mechanical polishing process is conducted already, and thus, only a slight polishing process of removing the barrier metal film from the surface of the interlayer insulation film is sufficient for the subsequent planarization process, and thus, introduction of residual stress again into the metal interconnection pattern as a result of the planarization process is effectively avoided. With regard to such a residual stress in the metal layer, it should be noted that the residual stress is relaxed for the Cu layer 34 as a whole in the example of the Cu layer 34 of FIG. 1G as a result of the thermal annealing process conducted for recrystallization and crystal grain growth, while there still exists a possibility that local residual stress still remains in the interior of the Cu layer 34 in such a case in which mere thermal annealing process is applied to the state in which such a thick Cu layer 34 is formed. Further, there still exists a possibility that a residual stress is introduced newly into the metal interconnection pattern at the time of the chemical mechanical polishing process of FIG. 1H. The present invention also solves such conventional problems.

What is claimed is:

1. A method of forming a multilayer interconnection structure, comprising the steps of:
    forming an interconnection trench in said interlayer insulation film;
    filling said interconnection trench with a metal layer; and
    removing a part of said metal layer deposited on a surface of said interlayer insulation film with a chemical mechanical polishing process to form a metal interconnection pattern in said interconnection trench,
    wherein there are further provided with the steps of:
    forming, after said step of chemical mechanical polishing, an oxide film by carrying out an oxidation process oxidizing a surface of said metal interconnection pattern; and
    removing said oxide films,
    wherein said step of forming said oxide film comprises a step of processing the surface of said metal interconnection pattern by oxygen plasma.

2. The method of forming a multilayer interconnection structure as claimed in claim 1, wherein said step of forming said oxide film is conducted so as to form said oxide film with a film thickness of 30 nm or less.

3. The method of forming a multilayer interconnection structure as claimed in claim 1, wherein said step of removing said oxide film is conducted by a dry process.

4. The method of forming a multilayer interconnection structure as claimed in claim 1, wherein said step of removing said oxide film is conducted in reducing plasma.

5. A method of forming a multilayer interconnection structure, comprising the steps of:
    forming an interconnection trench in an interlayer insulation film;
    filling said interconnection trench with a metal layer;
    removing a part of said metal layer deposited on a surface of said interlayer insulation film by a chemical mechanical polishing process;
    annealing said metal layer after said step of chemical mechanical polishing; and
    planarizing a surface of said metal interconnection layer after said annealing step.

6. The method of forming a multilayer interconnection structure as claimed in claim 5, wherein said step of filling said interconnection trench comprises the steps of covering an upper principal surface of said interlayer insulation film and a surface of said interconnection trench with a barrier metal film; and depositing said metal layer on said barrier metal film, wherein said chemical mechanical polishing stop is conducted while using said barrier metal film on said interlayer insulation film as a stopper.

7. The method of forming a multilayer interconnection structure as claimed in claim 5, wherein said thermal annealing process is conducted at a temperature that causes stress relaxation in said metal interconnection layer.

8. The method of forming a multilayer interconnection structure as claimed in claim 5, wherein said thermal annealing process is conducted at a temperature of 250° C. or higher.

9. The method of forming a multilayer interconnection structure as claimed in claim 5, wherein said planarization step comprises another chemical mechanical polishing process applied to said metal layer until a top surface of said interlayer insulation film is exposed.

10. The method of forming a multilayer interconnection structure as claimed in claim 5, wherein said step of filling said interconnection trench with said metal layer comprises the steps of filling an upper principal surface of said interlayer insulation film and a surface of said interconnection trench with a barrier metal film; and depositing said metal film on said barrier metal film, said chemical mechanical polishing step being carried out while using aid barrier metal film as a stopper, said planarizing step polishing said metal layer and said barrier metal film until said upper principal surface of said interlayer insulation film is exposed.

* * * * *